(12) United States Patent
Kamei

(10) Patent No.: US 6,201,419 B1
(45) Date of Patent: Mar. 13, 2001

(54) PEAK DETECTION CIRCUIT

(75) Inventor: Takahiro Kamei, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/315,031

(22) Filed: May 20, 1999

(30) Foreign Application Priority Data

May 22, 1998 (JP) .................................................. 10-141908

(51) Int. Cl.[7] ............................................... H03K 5/1534
(52) U.S. Cl. ................................. 327/77; 327/88; 327/89
(58) Field of Search ................................. 327/56, 58, 62, 327/65, 72, 77, 78, 79, 80, 81, 88, 89, 563; 330/252, 253

(56) References Cited

U.S. PATENT DOCUMENTS

| | | | |
|---|---|---|---|
| 5,420,530 | * 5/1995 | Mita ........................................ | 327/74 |
| 5,428,312 | * 6/1995 | Higeta et al. ........................ | 327/333 |
| 5,467,051 | * 11/1995 | Abdi ...................................... | 327/536 |
| 5,663,673 | * 9/1997 | Tanaka et al. ........................ | 327/412 |
| 5,841,314 | * 11/1998 | Brigate et al. ....................... | 327/536 |

* cited by examiner

Primary Examiner—Tuan T. Lam
(74) Attorney, Agent, or Firm—Venable; Norman N. Kunitz

(57) ABSTRACT

A collector of a transistor Q3 to a base of which an amplifier signal Sa generated from the differential amplifier is input is connected with one end of the resistive element RC1 and one end of a resistive element RC2. Other ends of the resistive element RC1 and RC2 are connected with a power source level Vcc and a base of the transistor Q3, respectively. When the emitter of the transistor Q3 is shorted to a ground level GND, for example, in case that a capacitive element CP is not charged enough, the electric potential of the collector of the transistor Q3 is lowered, and the electric potential of the base of the transistor Q3 is also lowered. Accordingly, inflow of the excess current to the transistor Q3 can be prevented.

19 Claims, 4 Drawing Sheets

PEAK DETECTION CIRCUIT

BACKGROUND OF THE INVENTION

The present invention relates to a peak detection circuit used in a device such as an Auto Gain Controlled Amplifier which detects a peak value of a predetermined signal.

FIG. 4 shows a peak detection circuit 101 according to a prior art. The peak detection circuit 101 includes a differential amplifier circuit comprising transistors Q1, Q2, resistive elements RL1, RL2, a first constant-current source CCS1, and an emitter-follower circuit comprising transistors Q3, Q4 connected each other in the way of darlington connection. The peak detection circuit 101 also includes a pad PAD, a capacitive element CP and a second constant-current source CCS2.

One end of the resistive element RL1 and one end of the resistive element RL2 are commonly connected with a power source level VCC. The other end of the resistive element RL1 is connected with a collector of the transistor Q1, whereas the other end of the resistive element RL2 is connected with a collector of the transistor Q2 and a base of the transistor Q3. The transistor Q1 is controlled by an input signal In which is input to a base of the transistor Q1, and the transistor Q2 is controlled by a reference signal Ref which is input to a base of the transistor Q2. Emitters of the transistors Q1, Q2 are connected with a ground level GND through the first constant-current source CCS1 which generates constant-current Ie.

Collectors of the transistor Q3, Q4 are commonly connected with the power source level Vcc. An emitter of the transistor Q3 is connected with a base of the transistor Q4 and the pad PAD. The pad PAD is connected with one end of the capacitive element CP, and the other end of the capacitive element CP is connected with the ground level GND. An emitter of the transistor Q4 is connected with the ground level GND through the second constant-current source CCS2 which generates a constant-current If. Thus, an output signal Out of the peak detection circuit 101 is output from the emitter of the transistor Q4.

In the following, the operation of the peak detection circuit 101 according to the prior art having the above-mentioned structure is described. The input signal In input to the base of the transistor Q1 is differentially amplified based on the reference signal Ref input to the base of the transistor Q2. The differentially amplified signal (referred as an amplifier signal Sa) is input to the base of the transistor Q3. At this step, if the voltage of the amplifier signal Sa is larger than the sum of the voltage of the capacitive element CP and the voltage between the base and the emitter (about 0.8 V) of the transistor Q3, the transistor Q3 is turned on. With such operation of the transistor Q3, a signal of "H" level is input to the base of the transistor Q4, the emitter of which outputs the output signal OUT based on the constant-current If generated from the second constant-current source CCS2. In short, the peak detection circuit 101 according to the prior art detects a peak voltage value of the input signal In by means of the reference signal Ref. A peak voltage value of the input signal In can be adjusted with ease by changing the voltage of the reference signal Ref.

After the transistor Q3 is turned off, the transistor Q4 remain in the on state for a predetermined period depending on time spent for discharge of the capacitive element CP which has been charged by an emitter current of the transistor Q3. The period of the transistor Q4 being kept in the on state is usually adjusted depending on the frequency of the input signal In. For example, in the case that the frequency of the input signal In is about 1 GHz, a capacitive element CP of some pFs is used in accordance with the frequency of the input signal. On the contrary, in the case that the frequency of the input signal In is about 100 GHz, a capacitive element CP of several hundreds pFs is required. When the peak detection circuit 101 is formed as a semiconductor integrated circuit, a chip capacitor (not shown) provided at the exterior of the circuit is connected with the pad PAD so as to match the frequency of the input signal In, because it is difficult to provide a capacitive element CP with a large capacitance of several hundreds pFs in the circuit.

However, in the peak detection circuit 101 according to the prior art, in the case that the chip capacitor connected with the capacitive element CP and pad PAD, is not charged enough, for example, immediately after rise of the power source voltage, when the input signal In is input and the transistor Q3 is turned on, an excessive amount of current flows into the transistor Q3. This causes deterioration of the transistor Q3. The same problem is caused when the pad PAD is contacted with the ground level GND for some reason, or when inappropriate voltage had been input to the pad PAD at the experimental operation of the peak detection circuit 101.

SUMMARY OF THE INVENTION

The present invention has been made in view of the above-mentioned problem, in association with the prior art peak detection circuit. Therefore an object of the invention is to provide a novel and improved peak detection circuit wherein a measure for protection from electric current is well achieved having a transistor to which an amplifier signal gained by amplifying the difference between a reference signal and an input signal is input.

In order to solve the above-mentioned problem, according to the first aspect of the invention, there is provided a peak detection circuit which detects a peak value of an input signal. The peak detection circuit according to the present invention is provided with a differential amplifier which amplifies the difference of the signal levels between a reference signal and the input signal and outputs an amplifier signal, a first transistor which includes a control electrode to which said amplifier signal is input, a first resistance one end of which is connected with a power source and the other end of which is connected with an input electrode of the first transistor, and a second resistance one end of which is connected with the control electrode and the other end of which is connected with the input electrode of the first transistor.

With this structure, if an output electrode of the first transistor is shorted to a ground level, and excess current flows from a power source to an input electrode, the electric potential difference between both ends of the first resistance is increased, and that of the second resistance is thereby decreased. Accordingly, electric current flowing into the input electrode of the first transistor is restrained with electric potential of the control electrode of the first transistor being lowered. As a result, the first transistor is protected against electric current.

According to the second aspect of the invention, there is provided a peak detection circuit which includes a differential amplifier which amplifies difference of signal levels between a reference signal and the input signal and outputs an amplifier signal, a first transistor which includes a control electrode to which said amplifier signal is input, a group of diodes including n diodes (n equals a natural number of one or more) connected serially in a forward direction, wherein a cathode electrode of a first diode is an input part thereof, and an anode electrode of a last diode is an output part thereof, and said input part is connected with the input electrode of the first transistor, and said output part is connected with the output electrode of the first transistor.

With this structure, if an output electrode of the first transistor is shorted to a ground level, and excess current flows from a power source to an input electrode, the electric current can be detoured through the diode group. Accordingly, the amount of electric current flowing into the input electrode of the first transistor is decreased, and the first transistor is thus protected against electric current.

The number of diodes n is decided so that the minimum voltage of the output electrode of the first transistor at ordinary operation is larger than the sum of the threshold voltages of diodes (the minimum voltage of a diode at which forward electric current starts to flow). With this, electric current never flows through diodes at ordinary operation. It is only when the electric potential of the output electrode of the first transistor is lowered excessively that a diode group functions to decrease the amount of electric current flowing into the first transistor.

In addition, as the sum of current capacitance of the n diodes is set to be larger than current capacitance of the first transistor, even though excessive amount of forward electric current flows through the diode group, damage to the diode group is prevented. Further, in the case that capacitive serge is input to the output electrode of the first transistor, the diode group absorbs the capacitive serge so that the damage to the first transistor is prevented.

Still further, according to the third aspect of the invention, there is provided a peak detection circuit which detects a peak value of an input signal, comprising a differential amplifier a which amplifies difference of signal levels between a reference signal and said input signal and outputs an amplifier signal, a first Q3 transistor which includes a control electrode to which said amplifier signal is input, a second Q6 transistor an input electrode of which is connected with an input electrode of said first transistor and an output electrode of which is connected with an output electrode of said first transistor and a third transmitter having an input electrode connected with a control electrode of the second transistor and a control electrode to which a second reference signal is input.

In the peak detection circuit having the above-mentioned structure, if the second transistor is controlled by a control signal with a constant voltage, excess current flowing into the first transistor can be detoured to the second transistor in the similar way to the peak detection circuit including a diode group, moreover, if the peak detection circuit adapts the above-mentioned structure, it is made possible to adjust the voltage sag of the output electrode of the first transistor more accurately than the diode group utilizing a sum of the rise of each of the diodes. If the current carrying capacity of the third transistor is regulated so that it is larger than that of the first transistor, the second transistor is protected against damage, even though excess current flows into the second transistor. Further, in case that capacitive serge is input to the output electrode of the first transistor, the second transistor absorbs the capacitive serge so that damage to the first transistor is prevented.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments. In the drawings.

PREFERRED EMBODIMENTS OF THE INVENTION

Some preferred embodiments of a peak detection circuit according to the present invention will now be described in the following with reference to the accompanying drawings. It is to be noted that in the following explanation, the same reference numbers are assigned to components having essentially identical functions and structural features to preclude the necessity for repeated explanation thereof.
(First Embodiment)

Figure 1:
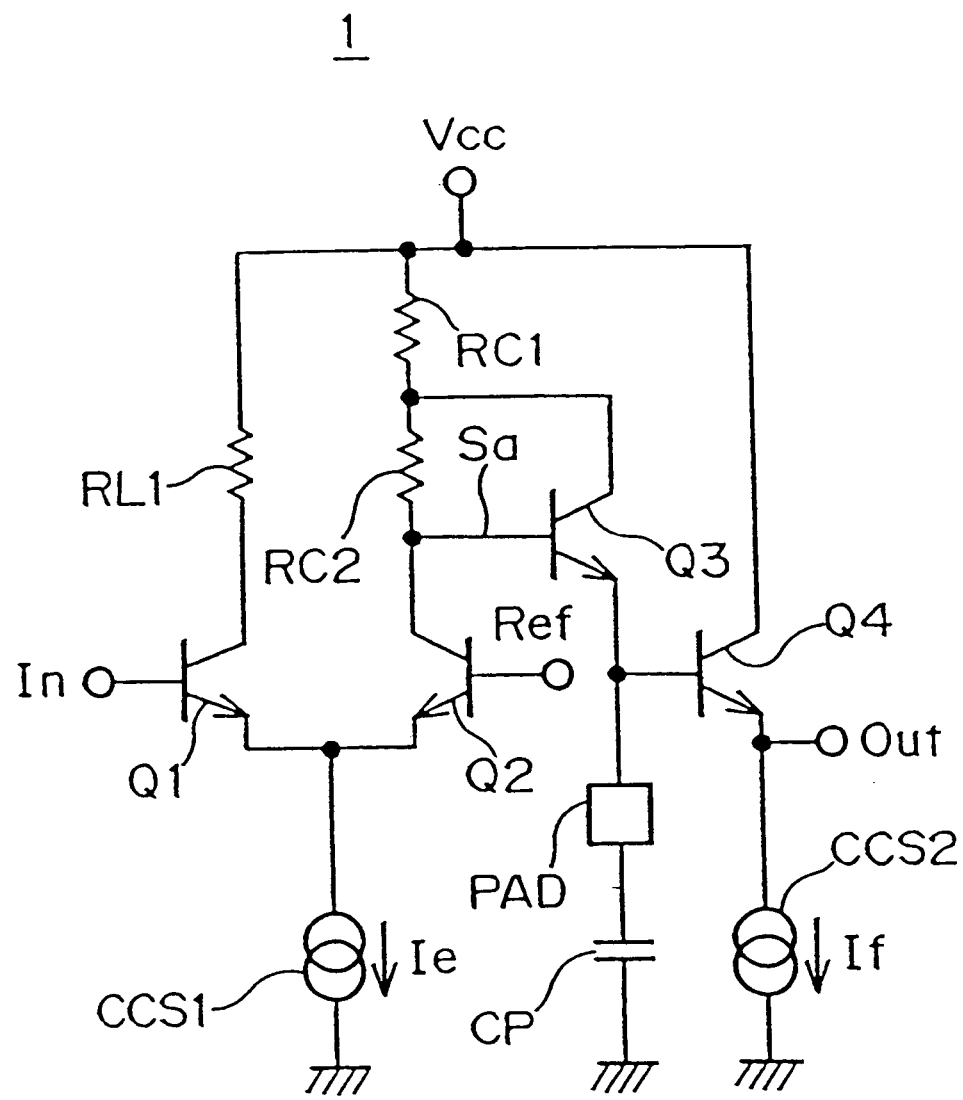
FIG. 1 is a circuit diagram illustrating the structure of the peak detection circuit according to the first embodiment of the invention.

FIG. 1 shows a circuit diagram illustrating a structure of a peak detection circuit 1 according to the first embodiment of the invention. In the peak detection circuit 1, a resistive element RL2 in the above-mentioned peak detection circuit 101 in the prior art is replaced by a resistive element RC1 as a first resistance and a resistive element RC2 as a second resistance which are connected serially. Another difference between the peak detection circuit 1 from the peak detection circuit 101 is that a collector of a transistor Q3 as a first transistor, which is connected with the power source level Vcc in the peak detection circuit 101, is connected at the junction between the resistive element RC1 and the resistive element RC2. In the peak detection circuit 1 according to the first embodiment of the invention, one end of the resistive element RC1 is connected with the power source level Vcc, while the other end is connected with a collector of the transistor Q3 as an input electrode and one end of the resistive element RC2. The other end of the resistive element RC2 is connected with a base of the transistor Q3 as a control electrode and a collector of a transistor Q2. Otherwise, the constitution of the peak detection circuit 1 according to the first embodiment of the invention is essentially identical with the peak detection circuit 101 according to the prior art.

If the peak detection circuit 1 according to the first embodiment is designed so that a sum of a resistance value of the resistive elements RC1 and RC2 which are serially connected equals a resistance value of the resistive element RL of the peak detection circuit 101, the operation of the peak detection circuit 1 is essentially identical with the operation of the peak detection circuit 101 in the prior art.

In the following, the operation of the peak detection circuit 1 according to the first embodiment is described. An input signal In input to a base of a transistor Q1 is differentially amplified based on a reference signal Ref input to a base of the transistor Q2. This differentially amplified signal (amplifier signal Sa) is input to the base of the transistor Q3. At this step, if a voltage value of the amplifier signal Sa is larger than the sum of a voltage value of a capacitive element CP and a voltage between the base and a emitter (about 0.8 V) of the transistor Q3, the transistor Q3 is turned on. With such operation of the transistor Q3, a signal of H level is input to a base of a transistor Q4, functioning as a second transistor, which outputs an output signal OUT from a emitter thereof based on constant current If generated from a second constant current source CCS2. Thus, the peak detection circuit 1 according to the first embodiment of the invention detects the peak value of the input signal In by means of the reference signal Ref as in the peak detection circuit 101 of the prior art. Therefore, the peak voltage value of the input signal In can be regulated with ease by changing a voltage value of the reference signal Ref.

In the following, the operation of the peak detection circuit 1 in case that the transistor Q3 may be deteriorated is described.

If the input signal In is input and the transistor Q3 is thereby turned on despite that a chip capacitor (not shown) connected to a pad PAD and the capacitive element CP are not charged enough, for example, immediately after rise of the power source voltage, an excessive amount of electric current flows into the collector of the transistor Q3. With this operation, an electric potential difference between both ends of the resistive element RC1 is increased. As a result, the electric potential of the collector of the transistor Q3, and that of the base of the transistor Q3 are lowered. Accordingly, as the voltage of the transistor Q3 between the base and the emitter is lowered, the amount of the electric current flowing into the transistor Q3 is restrained.

As has been described, the peak detection circuit 1 according to the first embodiment of the invention is designed so that if the electric current of the collector of the transistor Q3 is increased, the voltage of the transistor Q3 between the base and the emitter is lowered by the resistive elements RC1 and RC2. Therefore, the electric current of the collector can not increase above the predetermined value. Even though the emitter of the transistor Q3 functioning as the output electrode thereof is contacted with the ground level GND, the excess current does not flow into the transistor Q3 so that the transistor Q3 is prevented from deterioration.

(Second Embodiment)

Figure 2:
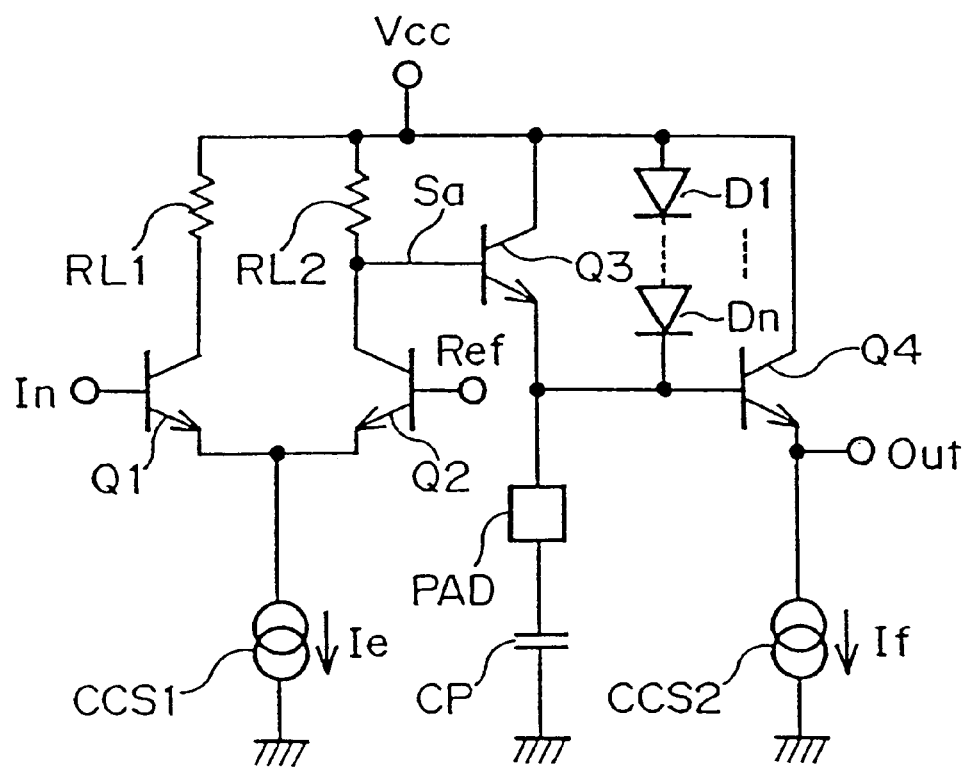
FIG. 2 is a circuit diagram illustrating the structure of the peak detection circuit according to the second embodiment of the invention.

FIG. 2 shows a structure of a peak detection circuit 11 according to the second embodiment of the invention. In addition to the components of the peak detection circuit 101 according to the prior art mentioned above, the peak detection circuit 11 includes n diodes D1, D2, . . . , Dn. A cathode of the diode D1 is connected with an anode of the diode D2, and a cathode of the diode D2 is connected with an anode of the diode D3. In this way, all the diodes from D1 through Dn are connected serially. An anode of the diode D1 is connected with a collector of a transistor Q3, and a cathode of the diode Dn is connected with an emitter of the transistor Q3.

The number of diodes n is decided so as to satisfy the following relational expression.

The power source level $Vcc-(n \times Vf) < Ve$

It is to be noted that when the peak detection circuit 11 performs the ordinary operation of detecting the peak voltage value of the input signal In, the minimum voltage value of the emitter of the transistor Q3 is Ve, and the value of the rising voltage Vf at which forward electric current starts to flow via each diode D1 through Dn is always the same.

According to the peak detection circuit 11 according to the second embodiment of the invention provided with n diodes D1 through Dn between the emitter and collector of the transistor Q3, electric current never flows through the diodes D1 through Dn during the ordinary operation of the circuit, and the operation of the peak detection circuit 11 is thus essentially identical with that of the peak detection circuit 101.

In the following, the operation of the peak detection circuit 11 in the case that the transistor Q3 may be deteriorated is described.

If the input signal In is input and the transistor Q3 is thereby turned on despite that an exterior chip capacitor connected to a pad PAD and the capacitive element CP are not charged enough, for example, immediately after rise of the power source voltage, an excessive amount of electric current flows to the transistor Q3, because the electric potential of the emitter of the transistor Q3 is considered as the ground level GND. However, as the voltages of each of the ends of the diodes D1 through Dn are larger than the rising voltage Vf, most of the electric current running from the power source level Vcc to the emitter of the transistor Q3 flows via the n diodes D1 through Dn. According to the peak detection circuit 11 of the second embodiment, even though the electric potential of the emitter of the transistor Q3 is lowered to the ground level GND, the transistor Q3 is protected against inflow of excess current. Thus, deterioration of the transistor Q3 is prevented.

In addition, in the peak detection circuit 11 according to the second embodiment of the invention, the diodes D1 through Dn, during ordinary operation of detecting the peak value, function as capacitive components. Therefore, as a capacitive serge input from the pad PAD is absorbed by the diodes D1 through Dn, the damage of transistor Q3 by capacitive serge is prevented.

(Third Embodiment)

Figure 3:
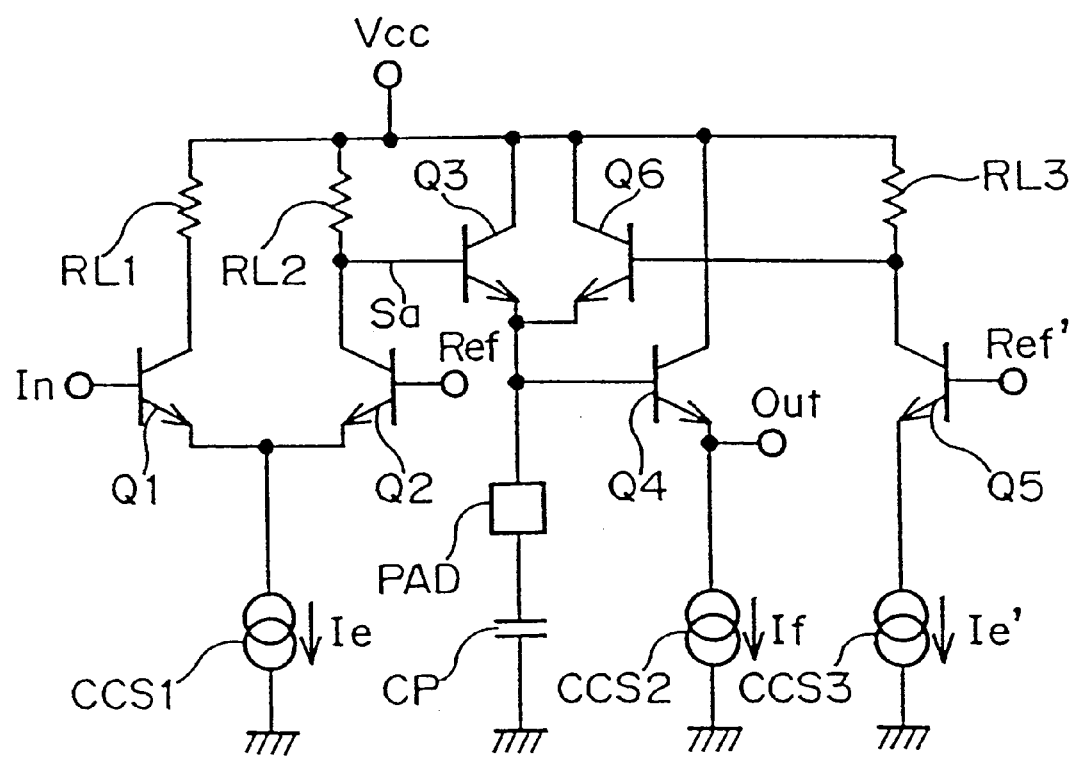
FIG. 3 is a circuit diagram illustrating the structure of the peak detection circuit according to the third embodiment of the invention.
Figure 4:
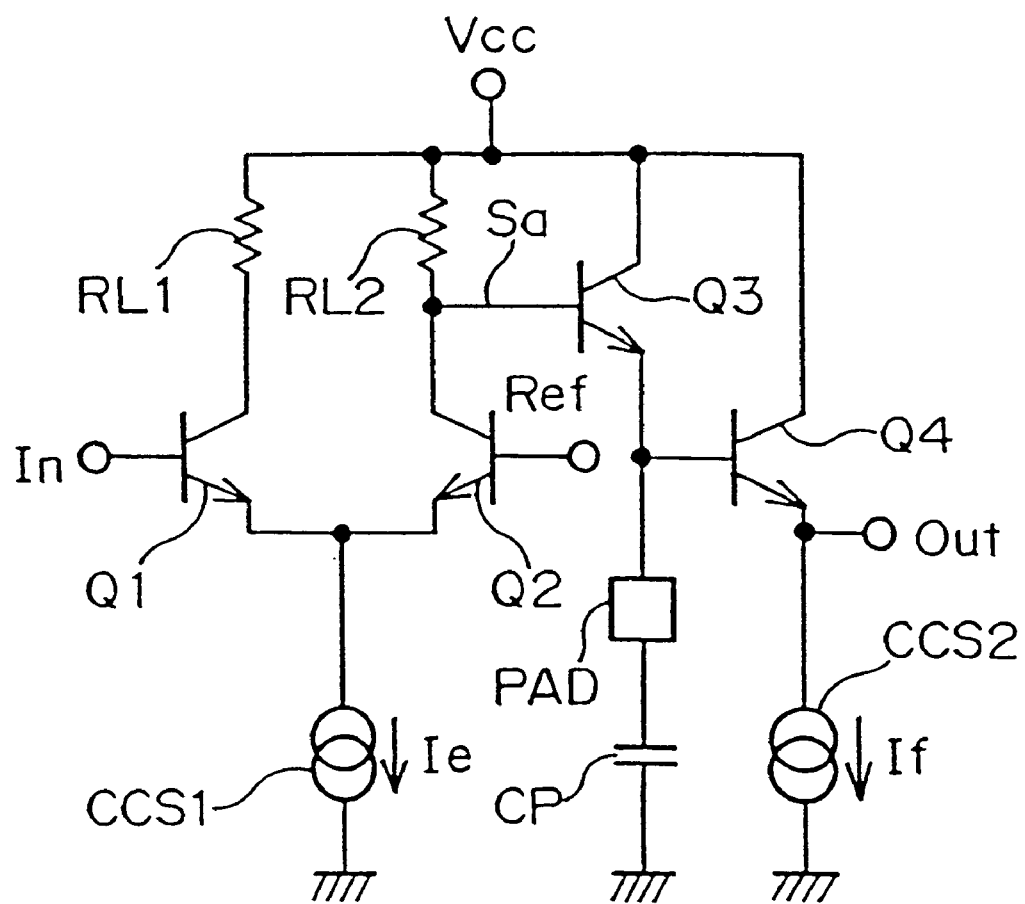
FIG. 4 is a circuit diagram illustrating the structure of the peak detection circuit according to the prior art.

FIG. 3 shows a structure of a peak detection circuit 21 according to the third embodiment of the invention. In the peak detection circuit 21, the diodes D1 through Dn of the peak detection circuit 11 according to the second embodiment of the invention are replaced by a resistive element RL3, a constant current power source CCS3, a transistor Q5, and a transistor Q6 functioning as a second transistor. In the peak detection circuit 21, one end of the resistive element RL3 is connected with a power source level Vcc, whereas other end of the resistive element RL3 is connected with a collector of the transistor Q5 and a base of the transistor Q6. A reference signal Ref' is input to a base of the transistor Q5, and an emitter of the transistor Q5 is connected with a ground level GND via the third constant current power source CCS3 which generates a constant electric current Ie'. A collector of the transistor Q6 is connected with the power source level Vcc, and an emitter of the transistor Q6 is connected with an emitter of a transistor Q3.

Here, the reference signal Ref', which is identical with a reference signal Ref input to a base of a transistor Q2, is input to the base of the transistor Q5, and the current value of the constant electric current Ie' generated from the third constant current power source CCS3 is regulated so as to be the same as that of a constant current Ie generated from a first constant current power source CCS1. With this step, and by setting the resistance constant of the resistive element RL3 half as much as that of a resistive element RL2, the emitter voltage of the transistor Q6 equals the minimum value of the emitter voltage of the transistor Q3 of the peak detection circuit 21 during ordinary operation. In this case, as electric current does not flows through the transistor Q6, the operation and the function of the peak detection circuit 21 according to the third embodiment of the invention are essentially identical with the peak detection circuit 101 according to the prior art.

In the following, the operation of the peak detection circuit 21 according to the third embodiment of the invention in the case that the transistor Q3 may be deteriorated is described.

If the input signal In is input and the transistor Q3 is thereby turned on despite that an exterior chip capacitor connected to a pad PAD and the capacitive element CP are not charged enough, for example, immediately after rise of the power source voltage, an excessive amount of electric current flows to the transistor Q3 because the electric potential of the emitter of the transistor Q3 is considered as the ground level GND. However, most of the electric current running from the power source of level Vcc to the emitter of the transistor Q3 flows via the transistor Q6. In addition, even when the peak value of the input signal In is detected, the voltage of the amplifier signal Sa, which is input to the base of the transistor Q3 rises and the transistor Q3, is turned on, and the amount of electric current flowing into the transistor Q3 is largely decreased by means of the transistor Q6. According to the peak detection circuit 21 of the third embodiment, even though electric potential of the emitter of the transistor Q3 is lowered to the ground level GND, the collector of the transistor Q3 is protected against inflow of excess current so that deterioration of the transistor Q3 is prevented. Moreover, unlike the transistor Q3, as the transistor Q6 is not required to switch at high speed, the transistor Q6 can be designed to have a large base size. With this structure, the transistor Q6 withstands excess current. In addition, when capacitive serge is input from the pad PAD, transistor Q6 absorbs the capacitive serge. Thus, the transistor Q3 is further protected from deterioration.

In case that the voltage level of the reference signal Ref, which is input to the base of the transistor Q2 in order to change the detection level of the peak voltage of the input signal In, is regulated, and the minimum value of the emitter voltage of the transistor Q3 is changed, according to the peak detection circuit 21 of the third embodiment of the invention, the emitter voltage of the transistor Q6 can be regulated with ease by regulating the voltage value of the constant current Ie' generated from the third constant current power source CCS3. Accordingly, even though the electric potential of the pad PAD is lowered, inflow of excess current into the transistor Q3 is prevented so the the transistor Q3 is protected from damage.

Examples of the peak detection circuit preferably embodying the invention have been discussed so far, with reference to the accompanying drawings. However, it is apparent that the invention should not be limited by those examples. It may be possible for anyone who is skilled in the art to devise various changes and modifications from the teachings described herein without departing from the technical idea as recited in the attached scope of claim for patent, and it will be understood that these changes and modifications fall in the technical scope of the invention.

For example, though the preferred embodiments of the invention describes the peak detection circuit including the bipolar transistors, the invention can also be applied to the peak detection circuit including the field effect transistors.

As has been described so far, according to the present invention, a transistor to which an amplifier signal, which is generated by amplifying the difference between a reference signal and an input signal is input, is protected against inflow of the excess current, even when an output electrode of the transistor is lowered to the ground level. Therefore, the transistor is prevented from deterioration.

The entire disclosure of Japanese Patent Application No. 10-141908 filed on May 22, 1998 including specification, claims, drawings and summary is incorporated herein by reference in its entirety.

What is claimed is:

1. A peak detection circuit for detecting a peak value of an input signal comprising:

a differential amplifier for amplifying a difference of signal levels between a reference signal and said input signal and outputs an amplifier signal;

a first transistor including a control electrode to which said amplifier signal is input;

a first resistance one end of which is connected with a power source and the other end of which is connected with an input electrode of said first transistor; and a second resistance one end of which is connected with said control electrode and the other end of which is connected with said input electrode of said first transistor.

2. A peak detection circuit as claimed in claim 1, wherein an output electrode of said first transistor is connected with a pad.

3. A peak detection circuit as claimed in claim 1, wherein said output electrode of said first transistor is connected with a control electrode of a second transistor.

4. A peak detection circuit which detects a peak value of an input signal, comprising:

a differential amplifier for amplifying a difference of signal levels between a reference signal and said input signal and outputs an amplifier signal;

a first transistor including a control electrode to which said amplifier signal is input;

a diode group including n diodes (n equals a natural number of 1 or more) connected serially in a forward direction, wherein a cathode electrode of a first diode is an input part thereof, and an anode electrode of a last diode is an output part thereof, and said input part is connected with an input electrode of said first transistor, and said output part is connected with an output electrode of said first transistor.

5. A peak detection circuit as claimed in claim 4, wherein the sum of current-carrying capacities of said n decodes is larger than that of said first transistor.

6. A peak detection circuit as claimed in claim 4, wherein said output part of said diode group is connected with a pad.

7. A peak detection circuit as claimed in claim 4, wherein said output part of said diode group is connected with a control electrode of a second transistor.

8. A peak detection circuit which detects a peak value of an input signal, comprising:

a differential amplifier which amplifies a difference of signal levels between a first reference signal and said input signal and outputs an amplifier signal;

a first transistor having a control electrode to which said amplifier signal is input;

a second transistor having an input electrode that is connected with an input electrode of said first transistor and an output electrode that is connected with an output electrode of said first transistor; and a third transistor having an input electrode that is connected with a control electrode of said second transistor, and a control electrode to which a second reference signal is input.

9. A peak detection circuit as claimed in claim 8, wherein said third transistor is controlled by said second reference signal.

10. A peak detection circuit as claimed in claim 8, wherein the current-carrying capacity of said third transistor is larger than that of said first transistor.

11. A peak detection circuit as claimed in claim 8, wherein an output electrode of said third transistor is connected with a pad.

12. A peak detection circuit as claimed in claim 8, wherein the output electrode of said second transistor is connected with a control electrode of a fourth transistor.

13. A peak detection circuit as claimed in claim 3 wherein said second transistor has an input electrode connected to said input electrode of said first transistor via said first resistance and an output electrode providing the output signal of said circuit.

14. A peak detector as claimed in claim 13 wherein said output electrode of said second transistor is connected to ground via a constant current source, and said output electrode of said first transistor is connected to a pad that is connected to ground via a capacitor.

15. A peak detection circuit as claimed in claim 7 wherein said second transistor has an input electrode connected to said input of said first transistor and an output electrode providing the output signal of said circuit.

16. A peak detection circuit as claimed in claim 15 wherein said output electrode of said second transistor is connected to ground via a constant current source, and said output electrode of said first transistor is connected to a pad that is connected to ground via a capacitor.

17. A peak detection circuit as claimed in claim 12 wherein said fourth transistor has an input electrode connected to said input electrode of said first transistor, and an output electrode providing the output signal of said circuit.

18. A peak detection circuit as claimed in claim 17 wherein said input electrode of said third transistor and said control electrode of said second transistor are connected to said input electrodes of said first and second transistors by a first resistor, and are connected to said control electrode of said first transistor via a second resistor that is an output load resistor of said differential amplifier.

19. A peak detection circuit as claimed in claim 18 wherein said output electrodes of said first and second transistors are connected to a pad that is connected to ground via a capacitor, said output electrode of said third transistor is connected to ground, via a first constant current source, and said output electrode of said fourth transistor is connected to ground via a second constant current source.

* * * * *